US011413965B2

(12) United States Patent
Fu et al.

(10) Patent No.: US 11,413,965 B2
(45) Date of Patent: Aug. 16, 2022

(54) HIGH VOLTAGE INTERLOCK CIRCUIT AND DETECTION METHOD THEREOF

(71) Applicant: Contemporary Amperex Technology Co., Limited, Ningde (CN)

(72) Inventors: Yanhui Fu, Ningde (CN); Guoxiu Wu, Ningde (CN); Baohai Du, Ningde (CN); Changjian Liu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/482,455

(22) Filed: Sep. 23, 2021

(65) Prior Publication Data

US 2022/0009351 A1 Jan. 13, 2022

Related U.S. Application Data

(63) Continuation of application No. PCT/CN2021/078723, filed on Mar. 2, 2021.

(30) Foreign Application Priority Data

May 22, 2020 (CN) ........................ 202010444444.X (51) Int. Cl.
 *B60L 3/00* (2019.01)
 *H03K 17/687* (2006.01)
(52) U.S. Cl.
 CPC ........ *B60L 3/0023* (2013.01); *H03K 17/6871* (2013.01)
(58) Field of Classification Search
 CPC .................. B60L 3/0023; H03K 17/6871
 See application file for complete search history.

(56) References Cited

U.S. PATENT DOCUMENTS

| 7,405,579 B2 * | 7/2008 | Okamoto | ........... G01R 31/3835 |
| | | | 324/429 |
| 10,578,662 B2 * | 3/2020 | Huang | .................. G01R 31/54 |

(Continued)

FOREIGN PATENT DOCUMENTS

| CN | 105313700 A | 2/2016 |
| CN | 104203635 B | 9/2016 |

(Continued)

OTHER PUBLICATIONS

The International search report for PCT Application No. PCT/CN2021/078723, dated Jun. 9, 2021, 12 pages.

(Continued)

*Primary Examiner* — Metasebia T Retebo
(74) *Attorney, Agent, or Firm* — Law Offices of Liaoteng Wang (57) ABSTRACT

The application discloses a high voltage interlock circuit and a detection method thereof. The circuit comprises: a first switching module; a second switching module, comprising a first driving unit and a first switching unit arranged in isolation, the first switching unit is arranged between a second power supply and a second power ground; a third switching module, comprising a second driving unit and a second switching unit arranged in isolation; a fourth switching module, arranged between the fourth power supply and the first power ground; a controller. The embodiments of the application improve the accuracy of fault detection.

13 Claims, 5 Drawing Sheets

(56) References Cited

U.S. PATENT DOCUMENTS

2014/0001840 A1    1/2014  Lenz et al.
2019/0184835 A1    6/2019  Karlsson
2021/0148995 A1*  5/2021  Kim ........................ G05B 9/02

FOREIGN PATENT DOCUMENTS

| CN | 109017317 A | 12/2018 |
|----|-------------|---------|
| CN | 109541494 A | 3/2019 |
| CN | 109782160 A | 5/2019 |
| CN | 208999516 U | 6/2019 |
| CN | 110261712 A | 9/2019 |
| CN | 110967616 A | 4/2020 |
| CN | 110967617 A | 4/2020 |
| CN | 210337589 U | 4/2020 |
| EP | 3699620 A1 | 8/2020 |
| WO | 2019054128 A1 | 3/2019 |

OTHER PUBLICATIONS

The extended European search report dated Mar. 28, 2022 for European application No. 21749521.7, 5 pages.

* cited by examiner

FIG. 1

| State type of high voltage component module | State of the first switching module | State of the forth switching module | First detection result | Second detection result |
|---|---|---|---|---|
| Normal state | Close | Open | Low level | High level |
| | Open | Close | High level | Low level |
| Short-connected power supply | Close | Open | Low level | High level |
| | Open | Close | High level | High level |
| Short-connected power groung | Close | Open | High level | High level |
| | Open | Close | High level | Low level |
| Open ciruit | Close | Open | High level | High level |
| | Open | Close | High level | High level |

HIGH VOLTAGE INTERLOCK CIRCUIT AND DETECTION METHOD THEREOF

CROSS-REFERENCE TO RELATED APPLICATIONS

The present application is a continuation of International Application No. PCT/CN2021/078723, filed on Mar. 2, 2021, which claims priority to Chinese patent application No. 202010444444.X entitled "HIGH VOLTAGE INTERLOCK CIRCUIT AND DETECTION METHOD THEREOF" filed on May 22, 2020, both of which are hereby incorporated by reference in their entireties.

FIELD OF THE INVENTION

The present application relates to the field of new energy, in particular to a high voltage interlock circuit and a detection method thereof.

BACKGROUND OF THE INVENTION

With the rapid development of new energy vehicles, people pay more and more attention to the safety of the new energy vehicles. The biggest difference between new energy vehicles and traditional vehicles is that new energy vehicles rely on high voltage and large current to provide power for vehicles, thus the high voltage safety problem cannot be ignored in the design of new energy vehicles. A common safety monitoring system for high voltage circuit is high voltage interlock circuit, which is mainly used to monitor on-off situation of various high voltage components (including high voltage connector, manual service disconnect (Manual Service Disconnect; MSD), or high voltage power supply equipment, etc.) in electric vehicles. Based to the detection situation, a vehicle controller can determine whether to disconnect the high voltage circuit, so that the vehicle is in a safe state.

The current voltage type detection scheme is to compare the voltage at input terminal and output terminal of the high voltage interlock circuit so as to determine whether the high voltage components are open, that is, the controller is directly connected to the input terminal and output terminal of the high voltage interlock circuit. When there is a large external voltage, it may damage the controller and affect the accuracy of fault detection.

SUMMARY OF THE INVENTION

The embodiments of the application provide a high voltage interlock circuit and its detection method, which avoids direct detection for the signals of high voltage interlock input terminal and output terminal, thereby preventing the damage to the controller from external large voltage, and improving the accuracy of fault detection for high voltage components.

According to one aspect of the embodiments of the application, a high voltage interlock circuit is provided, including:

A first switching module, one terminal of the first switching module is connected to a first power supply, and the other terminal of the first switching module is connected to one terminal of a high voltage component module and a first power ground;

A second switching module, comprising a first driving unit and a first switching unit arranged in isolation, the first driving unit is used to drive the first switching unit to close, a current input terminal of the first driving unit is connected to the other terminal of the high voltage component module, one terminal of the first switching unit is connected to a second power supply, and the other terminal of the first switching unit is connected to a second power ground;

A third switching module, comprising a second driving unit and a second switching unit arranged in isolation, the second driving unit is used to drive the second switching unit to close, a current output terminal of the second driving unit is connected to the other terminal of the high voltage component module, one terminal of the second switching unit is connected to a third power supply, and the other terminal of the second switching unit is connected to the second power ground;

A fourth switching module, one terminal of the fourth switching module is connected to a fourth power supply, and the other terminal of the fourth switching module is connected to a current output terminal of the first driving unit, a current input terminal of the second driving unit and the first power ground;

A controller, for controlling the first switching module and the fourth switching module to close alternately, obtaining a first detection result at one terminal of the first switching unit and a second detection result at one terminal of the second switching unit, and determining the fault of the high voltage component module based on the first detection result and the second detection result.

According to another aspect of the embodiments of the application, a detection method for high voltage interlock circuit is provided, which is applied to the high voltage interlock circuit provided by the embodiments of the application, the method comprising:

Controlling a first switching module and a fourth switching module to close alternately;

Obtaining a first detection result at one terminal of the first switching unit and a second detection result at one terminal of the second switching unit;

Determining the fault of the high voltage component module based on the first detection result and the second detection result.

In the embodiments of the present application, a signal detection terminal may be isolated from the input terminal of the high voltage interlock circuit and the output terminal of the high voltage interlock circuit due to the isolation setting of the first driving unit and the first switching unit in the second switching module and the isolation setting of the second driving unit and the second switching unit in the third switching module, so as to avoid the damage to the controller caused by large external voltage from the shorting of the high voltage component module. Moreover, by using the first detection result and the second detection result obtained when the first switching module and the fourth switching module are alternately closed, the fault type of the high voltage component module can be accurately determined, and the accuracy of fault detection for the high voltage interlock circuit can be improved.

BRIEF DESCRIPTION OF THE DRAWINGS

In order to illustrate the technical solution of the embodiments of the application more clearly, the drawings needed to be used in the embodiments of the application will be briefly introduced below. It is obvious that the drawings described below are only some embodiments of the application. For ordinary technicians in the art, other drawings may also be obtained from the drawings below without paying creative labor.

DETAILED DESCRIPTION

The embodiments of the present application are further described in detail in combination with the drawings and the embodiments. The following detailed description and drawings of the embodiments are used to illustrate the principle of the application as example, but not to limit the scope of the application, that is, the application is not limited to the described embodiments.

In the description of the application, it is noted that unless otherwise specified, "multiple" means more than two; the orientation or position relationship indicated by the terms "up", "down", "left", "right", "inside", "outside" is only for the convenience of describing the application and simplifying the description, rather than indicating or implying that the device or element referred to must have a specific orientation, be constructed and operated in a specific orientation, so it cannot be understood as a limitation of the application. In addition, the terms "first", "second", "third" and so on are used for descriptive purposes only, and cannot be understood to indicate or imply relative importance. "Perpendicular" is not perpendicular in the strict sense, but within the allowable range of error. "Parallel" is not parallel in the strict sense, but within the allowable range of error.

The orientation words appearing in the following description are all the directions shown in the figures, and are not intended to limit the specific structure of the application. In the description of the application, it should also be noted that unless otherwise specified and limited, the terms "install", "interconnect" and "connect" should be understood in a broad sense. For example, it may be fixed connection, detachable connection or integrated connection; and it may be connected directly or indirectly through intermediate media. For those skilled in the art, the specific meaning of the above terms in the application can be understood according to the specific situation.

Figure 1:
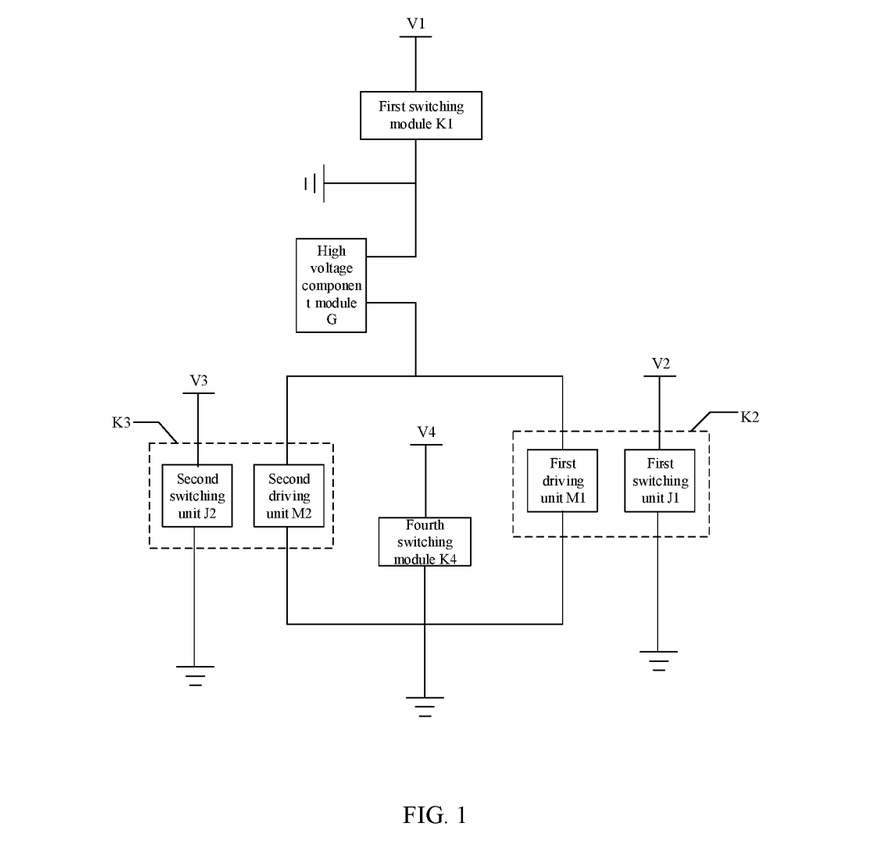
FIG. 1 is a structural diagram for an embodiment of the high voltage interlock circuit according to the application.

FIG. 1 shows a structural diagram of an embodiment of the high voltage interlock circuit according to the application. As shown in FIG. 1, the high voltage interlock circuit includes:

A first switching module K1, one terminal of the first switching module K1 being connected to the first power supply V1, and the other terminal of the first switching module K1 being connected to one terminal of the high voltage component module G and a first power ground;

A second switching module K2, comprising a first driving unit M1 and a first switching unit J1 which are arranged in isolation, the first driving unit M1 being used to drive the first switching unit J1 to close, a current input terminal of the first driving unit M1 being connected to the other terminal of the high voltage component module G, and one terminal of the first switching unit J1 being connected to a second power supply V2 and the other terminal of the first switching unit J1 to a second power ground;

A third switching module K3, comprising a second driving unit M2 and a second switching unit J2 which are arranged in isolation, the second driving unit M2 being used to drive the second switching unit J2 to close, a current output terminal of the second driving unit M2 being connected to the other terminal of the high voltage component module G, and one terminal of the second switching unit J2 being connected to a third power supply V3 and the other terminal of the second switching unit J2 to the second power ground;

A fourth switching module K4, one terminal of which is connected to the fourth power supply V4, and the other terminal of which is connected to a current output terminal of the first driving unit M1, a current input terminal of the second driving unit M2 and the first power ground; and A controller for controlling the first switching module K1 and the fourth switching module K4 to close alternately, obtaining a first detection result at one terminal of the first switching unit J1 and a second detection result at one terminal of the second switching unit J2, and determining the fault of the high voltage component module G based on the first detection result and the second detection result.

Herein, the isolation setting refers to not to connect via a wire. That is to say, the driving unit does not drive the switching unit to close via a wire. For example, the driving unit may drive the switching unit to close by means of optical reaction, magnetic reaction, etc.

As an example, the first driving unit M1 and/or the second driving unit M2 are light emitting elements. The first switching unit J1 and/or the second switching unit J2 are optical switches. Specifically, when there is a current passing through a light emitting element, the light emitting element emits light, and the light emitting element may drive an optical switch to close.

In the embodiments of the application, in order to prevent the shorting between the first power supply V1 and the first power ground when the first switching module K1 is closed, a resistance wire with a certain resistance may be used to realize the connection between the first switching module K1 and the first power ground, or an anti-shorting circuit structure may be set between the first power supply V1 and the first power ground. Similarly, in order to prevent the shorting between the second power supply V2 and the second power ground when the second switching module K2 is closed, a resistance wire with a certain resistance may be used to realize the connection between the second switching module K2 and the second power ground, or an anti-shorting circuit structure may be set between the second power supply V2 and the second power ground. In order to prevent the shorting between the third power supply V3 and the second power ground when the third switching module K3 is closed, a resistance wire with a certain resistance may be used to realize the connection between the third switching module K3 and the second power ground, or an anti-shorting structure may be set between the third power supply V3 and the second power ground. In order to prevent the shorting between the fourth power supply V4 and the first power ground when the fourth switching module K4 is closed, a resistance wire with a certain resistance may be used to realize the connection between the fourth switching module K4 and the first power ground, or an anti-shorting structure may be set between the fourth power supply V4 and the first power ground.

In the embodiments of the application, since the first driving unit M1 and the first switching unit J1 in the second switching module K2 are arranged in isolation, and the second driving unit M2 and the second switching unit J2 in the third switching module K3 are arranged in isolation, the signal detection terminals (i.e. one terminal of the first switching unit J1 and one terminal of the second switching unit J2) may be isolated from the input terminal of the high voltage interlock circuit (i.e. the other terminal of the high voltage component module G) and the output terminal of the high voltage interlock circuit (i.e. one terminal of the high voltage component module G), so as to avoid direct detection for the voltage at the input terminal and output terminal of the high voltage interlock circuit, preventing the damage to the controller caused by large external voltage from the shorting of the high voltage component module G. Moreover, by using the first detection result and the second detection result obtained when the first switching module K1 and the fourth switching module K4 are closed alternately, the fault type of the high voltage component module G can be accurately determined, and the accuracy of fault detection for the high voltage interlock circuit is improved.

In the embodiments of the application, the isolation between the first power ground and the second power ground is also to isolate the signal detection terminal from the input terminal of the high voltage interlock circuit and the output terminal of the high voltage interlock circuit, so as to further avoid the damage to the controller.

In the embodiments of the application, the fault types of the high voltage component module G include open circuit fault, short-connected power supply and short-connected power ground.

In the embodiments of the application, since a current input terminal of the first driving unit M1 is connected to the other terminal of the high voltage component module G, and a current output terminal of the second driving unit M2 is connected to the other terminal of the high voltage component module G, the third switching module K3 and the second switching module K2 are closed alternately when the first switching module K1 and the fourth switching module K4 are closed alternately.

When the high voltage component module G is in normal operation, if the first switching module K1 is closed and the fourth switching module K4 is open, the second switching module K2 is closed and the third switching module K3 is open, thus the first detection result has a voltage in proximity to 0, and the second detection result has a voltage in proximity to the third power supply V3. If the fourth switching module K4 is closed and the first switching module K1 is open, the second switching module K2 is open and the third switching module K3 is closed, thus the first detection result has a voltage in proximity to the second power supply V2, and the second detection result has a voltage in proximity to 0.

In the case that the open circuit fault of the high voltage component module G occurs, if the first switching module K1 is closed and the fourth switching module K4 is open, the second switching module K2 and the third switching module K3 are both open, thus the first detection result is a voltage close to the second power supply V2, and the second detection result is a voltage close to the third power supply V3. If the fourth switching module K4 is closed and the first switching module K1 is open, the second switching module K2 and the third switching module K3 are also both open, thus the first detection result is a voltage close to the second power supply V2, and the second detection result is a voltage close to the third power supply V3.

In the case that the short-connected power supply fault of the high voltage component module G occurs, if the first switching module K1 is closed and the fourth switching module K4 is open, the second switching module K2 is closed and the third switching module K3 is open, thus the first detection result is a voltage close to 0, and the second detection result is a voltage close to the third power supply V3. If the fourth switching module K4 is closed and the first switching module K1 is open, both the second switching module K2 and the third switching module K3 are open, thus the first detection result is a voltage close to the second power supply V2, and the second detection result is a voltage close to the third power supply V3.

In the case that the short-connected power ground fault of the high voltage component module G occurs, if the first switching module K1 is closed and the fourth switching module K4 is open, the second switching module K2 and the third switching module K3 are open, thus the first detection result is a voltage close to the second power supply V2, and the second detection result is a voltage close to the third power supply V3. If the fourth switching module K4 is closed and the first switching module K1 is open, the second switching module K2 is open and the third switching module K3 is closed, thus the first detection result is a voltage close to the second power supply V2, and the second detection result is a voltage close to 0.

In general, the obtained analog voltage signal of the detection terminal is converted into a digital signal by the controller. The controller includes a voltage comparator, which compares the received analog voltage with the preset upper and lower voltage limits. If the analog voltage is greater than the upper voltage limit, the detected voltage signal is considered to be a high level signal; if the analog voltage is less than the lower voltage limit, the detected voltage signal is considered to be a low level signal.

Since the converted digital signal may be used by the controller for fault detection, in order to accurately distinguish the normal operating state of the high voltage component module G from various fault states of the high voltage component module G, a first preset voltage threshold (i.e. upper voltage limit value) may be set based on the voltage of power supply V2 and power supply V3, and a second preset voltage threshold (i.e. lower voltage limit value) may be set based on the voltage of power ground, so that the normal state, open circuit fault, short-connected power supply and short-connected power ground may be distinguished accurately.

As an example, if both the power supply V2 and power supply V3 are 5V, the first preset voltage threshold may be set to 3.5V and the second preset voltage threshold may be set to 0.5V. If the detected voltage is greater than 3.5V, the detected voltage signal is considered as high level signal; if the detected voltage is less than 0.5V, the detected voltage signal can be considered as low level signal.

Figure 2:
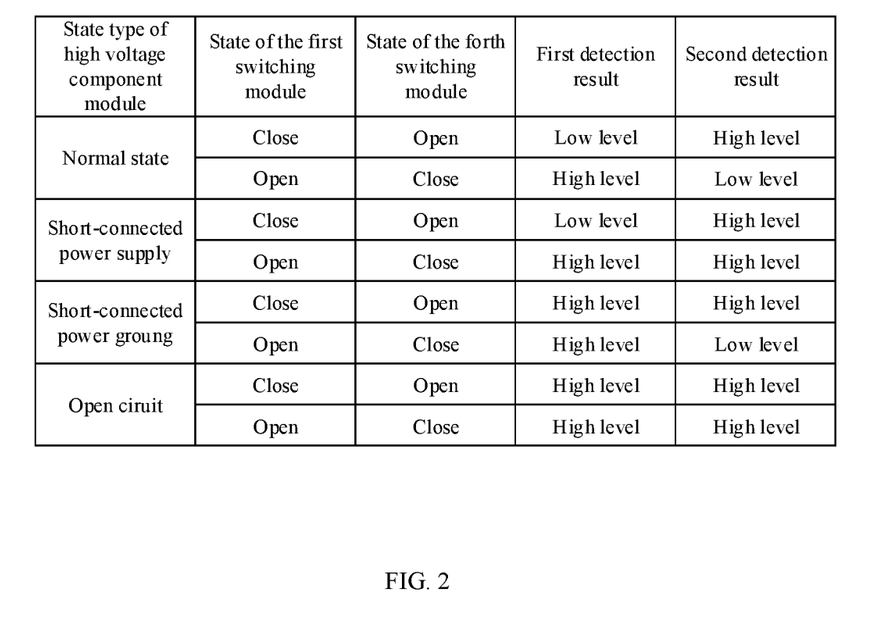
FIG. 2 is a state type table for an example of the high voltage interlock circuit according to the embodiments of the application.

As shown in FIG. 2, when the first switching module K1 is closed, if the first detection result is less than the second preset voltage threshold (that is, the first detection result is a low-level signal), and the second detection result is greater than the first preset voltage threshold (that is, the second detection result is a high-level signal), and when the fourth switching module K4 is closed, if the first detection result is greater than the first preset voltage threshold (that is, the first detection result is a high-level signal), and the second detection result is less than the second preset voltage threshold (that is, the second detection result is a low-level signal), then the high voltage component module G is in a normal operating state.

When the first switching module K1 is closed, if the first detection result is less than the first preset voltage threshold (that is, the first detection result is a low-level signal), and the second detection result is greater than the second preset voltage threshold (that is, the second detection result is a high-level signal), and when the fourth switching module K4 is closed, if both the first detection result and the second detection result are greater than the second preset voltage threshold (that is, both the first detection result and the second detection result are high-level signals), then it is determined that the high voltage component module G has a short-connected power supply fault, as shown in FIG. 2.

When the first switching module K1 is closed, if both the first detection result and the second detection result are greater than the second preset voltage threshold (that is, both the first detection result and the second detection result are high-level signals), and when the fourth switching module K4 is closed, if the first detection result is greater than the second preset voltage threshold (that is, the first detection result is a high-level signal), and the second detection result is less than the first preset voltage threshold (that is, the second detection result is a low-level signal), then it is determined that the high voltage component module G has a short-connected power ground fault, as shown in FIG. 2.

When the first switching module K1 is closed, if both the first detection result and the second detection result are greater than the second preset voltage threshold (that is, both the first detection result and the second detection result are high-level signals), and when the fourth switching module K4 is closed, if both the first detection result and the second detection result are greater than the second preset voltage threshold (that is, both the first detection result and the second detection result are high level signals), then it is determined that the high voltage component module G has an open circuit fault, as shown in FIG. 2.

Figure 3:
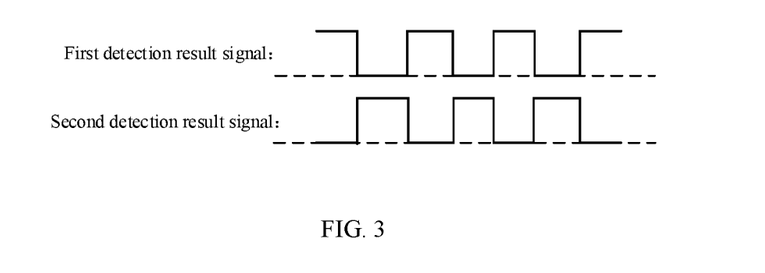
FIG. 3 is a waveform diagram for an example of the first detection result and the second detection result of the high voltage component module in a normal operating state according to the embodiments of the application.

In the embodiments of the application, if the first switching module K1 and the fourth switching module K4 are closed alternately for many times (the fourth switching module K4 is closed first), when the high voltage component module G is in a normal operation, the first detection result and the second detection result present two kinds of pulse width modulation (PWM) waveforms in opposite directions as shown in FIG. 3.

Figure 4:
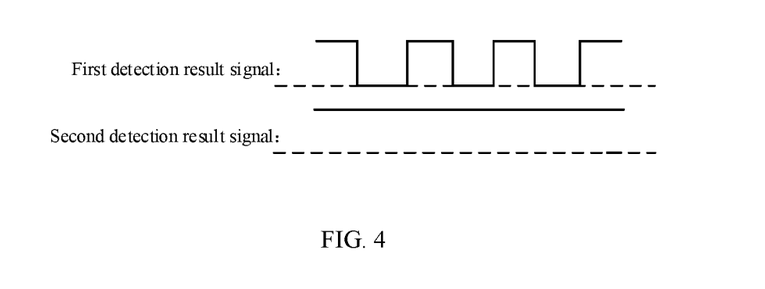
FIG. 4 is a waveform diagram for an example of the first detection result and the second detection result when the high voltage component module is short connected to a power supply according to the embodiments of the application.

In the embodiments of the application, if the first switching module K1 and the fourth switching module K4 are closed alternately for many times (the fourth switching module K4 is closed first), when the high voltage component module G has a short-connected power supply fault, a waveform diagram of the first detection result and the second detection result is shown in FIG. 4.

Figure 5:
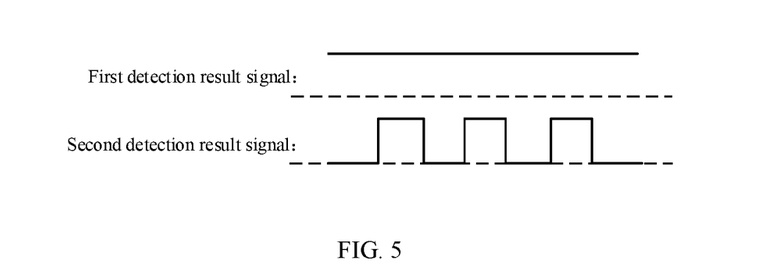
FIG. 5 is a waveform diagram for an example of the first detection result and the second detection result when the high voltage component module is short connected to a power ground according to the embodiments of the application.

In the embodiments of the application, if the first switching module K1 and the fourth switching module K4 are closed alternately for many times (the fourth switching module K4 is closed first), when the high voltage component module G has a short-connected power ground fault, a waveform diagram of the first detection result and the second detection result is shown in FIG. 5.

Figure 6:
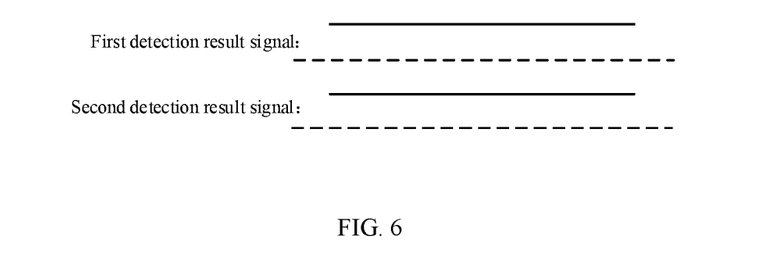
FIG. 6 is an example waveform diagram for the first detection result and the second detection result when the high voltage component module is open circuit according to the embodiments of the application.

In the embodiments of the application, if the first switching module K1 and the fourth switching module K4 are closed alternately for many times (the fourth switching module K4 is closed first), when the high voltage component module G has an open circuit fault, a waveform diagram of the first detection result and the second detection result is shown in FIG. 6.

That is to say, in the embodiments of the application, the first switching module K1 and the fourth switching module K4 may be closed alternately at least once, and then the waveform diagrams of the first detection result and the second detection result obtained can be used to determine whether the high voltage component module G has a fault.

In the embodiments of the application, by controlling the first switching module K1 and the fourth switching module K4 to close alternately for many times, the waveforms corresponding to the first detection result and the second detection result are used to fast and accurately determine whether the high voltage component module G has a fault and the type of the fault, thus improving the accuracy of the detection for the high voltage component module G.

In some embodiments of the application, the controller may also control the first switching module K1 and the fourth switching module K4 to be disconnected, obtain the third detection result at one terminal of the first switching unit J1 and the fourth detection result at one terminal of the second switching unit J2, and determine the fault of the high voltage component module G based on the third detection result and the fourth detection result.

When the high voltage component module G is in a normal operation, if the first switching module K1 and the fourth switching module K4 are disconnected, the second switching module K2 and the third switching module K3 are disconnected, thus the first detection result is a voltage close to the second power supply V2, and the second detection result is a voltage close to the third power supply V3.

When the high voltage component module G has a short-connected power supply fault, if both the first switching module K1 and the fourth switching module K4 are disconnected, the second switching module K2 is closed and the third switching module K3 is disconnected, thus the first detection result is a voltage close to 0, and the second detection result is a voltage close to the third power supply V3.

That is to say, when both the first switching module K1 and the fourth switching module K4 are disconnected, if both the third detection result and the fourth detection result are greater than the first preset voltage threshold (that is, both the third detection result and the fourth detection result are high level), the high voltage component module G is in a normal operating state.

When both the first switching module K1 and the fourth switching module K4 are disconnected, if the third detection result is less than the second preset voltage threshold (that is, the third detection result is low level), and the fourth detection result is greater than the first preset voltage threshold (that is, the fourth detection result is high level), then the high voltage component module G has a short-connected power supply fault.

In the embodiments of the application, by controlling the first switching module K1 and the fourth switching module K4 to be disconnected, so as to quickly locate whether the high voltage component module G has a short-connected power supply fault, the detection efficiency for the faults of the high voltage component module G is improved.

Figure 7:
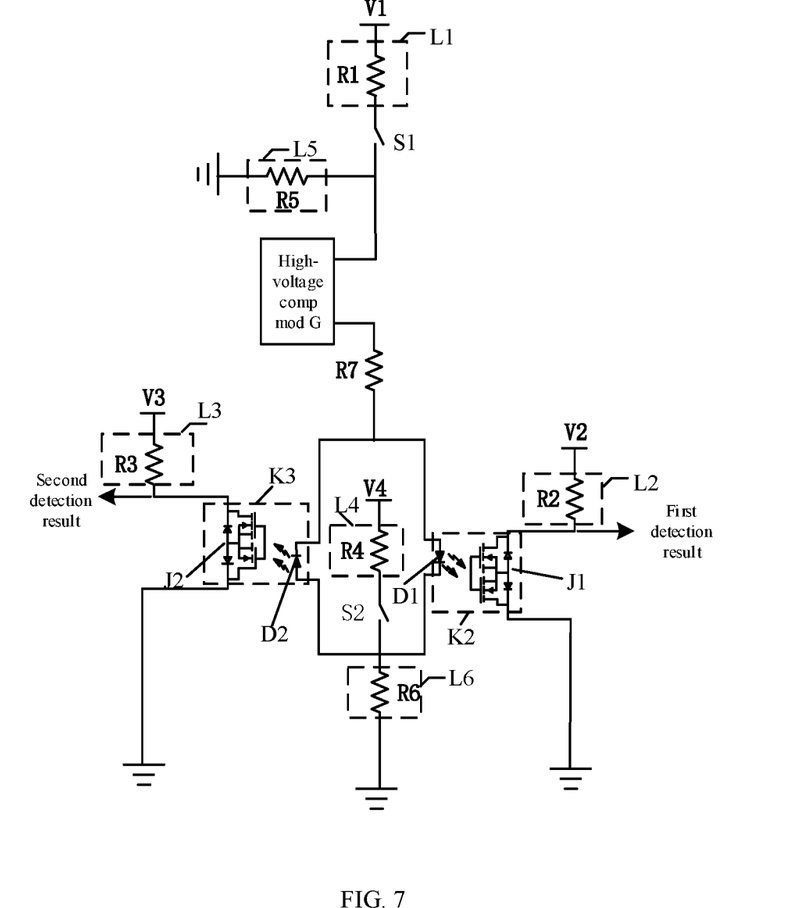
FIG. 7 is a structural diagram for another embodiment of the high voltage interlock circuit according to the application.

FIG. 7 shows a structural diagram for another embodiment of the high voltage interlock circuit according to the application. FIG. 7 shows a specific structure diagram of the first switching module K1, the second switching module K2, the third switching module K3 and the fourth switching module K4 in FIG. 1.

As shown in FIG. 7, the first switching module K1 includes a switch S1, the first driving unit M1 is a photodiode D1, and the first switching unit J1 includes two metal oxide semiconductor field-effect transistors (MOSFETs). The second driving unit M2 is a photodiode D2, and the second switching unit J2 also includes two MOSFETs. The fourth switching module K4 includes a switch S2.

One terminal of the switch S1 is connected to the first power supply V1, and the other terminal of the switch S1 is connected to one terminal of the high voltage component module G and the first power ground. One terminal of the switch S2 is connected to the fourth power supply V4, and the other terminal of the switch S2 is connected to a cathode (current output terminal) of the photodiode D1, an anode (current input terminal) of the photodiode D2 and the second power ground, respectively.

A cathode (current output terminal) of the photodiode D2 and an anode (current input terminal) of the photodiode D1 are both connected to the other terminal of the high voltage component module G.

The first switching unit J1 includes two MOSFETs, wherein the gates are connected to each other, and the sources are also connected to each other. A drain of one MOSFET is connected to the second power ground, and a drain of the other MOSFET is connected to the second power supply V2. When there is a current flowing through the photodiode D1, the photodiode D1 emits light, and the two MOSFETs in the first switching unit J1 are both closed, that is, the first switching unit J1 is also closed.

The second switching unit J2 also includes two MOSFETs, wherein the gates are connected to each other, and the sources are also connected to each other. A drain of one MOSFET is connected to the second power ground, and a drain of the other MOSFET is connected to the third power supply V3. When there is a current flowing through the photodiode D2, the photodiode D2 emits light, and the two MOSFETs in the second switching unit J2 are both turned on, that is, the second switching unit J2 is also closed.

In other examples, the first switching unit J1 and the second switching unit J2 may also include only one MOSFET. When the first switching unit J1 only includes one MOSFET, a source of the MOSFET is connected to the second power ground, and a drain of the MOSFET is connected to the second power supply V2. When the second switching unit J2 includes only one MOSFET, a source of the MOSFET is connected to the second power ground, and a drain of the MOSFET is connected to the third power supply V3.

Still in some examples, both the first switching unit J1 and the second switching unit J2 may be triodes. When the first switching unit J1 only includes a triode, an emitter of the triode is connected to the second power ground, and a collector of the triode is connected to the second power supply V2. When the second switching unit J2 only includes a triode, an emitter of the triode is connected to the second power ground, and a collector of the triode is connected to the third power supply V3.

Referring to FIG. 7, in some embodiments of the application, in case that the short-connected power ground fault of the high voltage component module G occurs, when the first switching module K1 is closed, in order to avoid the shorting between the first power supply and the power ground cause the damage to the first switching module K1, and in order to limit the current to protect the second switching module K2 and the third switching module K3, the high voltage interlock circuit also comprises a first current limiting module L1 arranged between the first switching module K1 and the first power supply V1. As an example, the first current limiting module L1 includes a first resistor network. Specifically, the first resistor network includes a resistor R1, wherein one terminal of the resistor R1 is connected to the first power supply V1, and the other terminal of the resistor R1 is connected to one terminal of the switch S1.

Referring to FIG. 7, in some embodiments of the application, when the second switching module K2 is closed, in order to avoid the shorting between the second power supply V2 and the second power ground cause the damage to the second switching module K2, the high voltage interlock circuit according to the embodiments of the application also includes a second current limiting module L2 arranged between the second power supply V2 and one terminal of the first switching unit J1. As an example, the second current limiting module L2 includes a second resistor network. Specifically, the second resistor network includes a resistor R2, wherein one terminal of the resistor R2 is connected to the second power supply V2, and the other terminal of the resistor R2 is connected to a drain of the MOSFET in the first switching unit J1.

Referring to FIG. 7, when the third switching module K3 is closed, in order to avoid the shorting between the third power supply V3 and the second power ground cause the damage to the third switching module K3, the high voltage interlock circuit according to the embodiments of the application also includes a third current limiting module L3 arranged between the third power supply V3 and one terminal of the second switching unit J2. As an example, the third current limiting module L3 includes a third resistor network. Specifically, the third resistor network includes a resistor R3, wherein one terminal of the resistor R3 is connected to the third power supply V3, and the other terminal of the resistor R3 is connected to a drain of the MOSFET in the second switching unit J2.

Referring to FIG. 7, in some embodiments of the application, when the fourth switching module K4 is closed, in order to avoid the short-connected power ground fault of the high voltage component module G, the shorting between the fourth power supply V4 and the power ground cause the damage to the fourth switching module K4, and in order to limit the current to protect the second switching module K2 and the third switching module K3, the high voltage interlock circuit also comprises a fourth current limiting module L4 arranged between the fourth switching module K4 and the fourth power supply V4. As an example, the fourth current limiting module L4 includes a fourth resistor network. Specifically, the fourth resistor network includes a resistor R4, wherein one terminal of the resistor R4 is connected to the fourth power supply V4, and the other terminal of the resistor R4 is connected to one terminal of the switch S2.

Referring to FIG. 7, in some embodiments of the application, when the high voltage component module G is short connected to the power supply, in order to avoid the electric signal flowing directly to the first power ground cause the damage to the devices in the high voltage interlock circuit, the high voltage interlock circuit also includes a fifth current limiting module L5 arranged between the other terminal of the first switching module K1 and the first power ground. As an example, the fifth current limiting module L5 includes a fifth resistor network. Specifically, the fifth resistor network includes a resistor R5, wherein one terminal of the resistor R5 is connected to the other terminal of the switch S1, and the other terminal of the resistor R5 is connected to the first power ground.

Referring to FIG. 7, in some embodiments of the application, when the high voltage component module G is short connected to the power supply or in an open circuit, in order to avoid the electrical signal output by the fourth power supply V4 flowing directly to the first power ground cause the damage to the fourth switching module K4, the high voltage interlock circuit also includes a sixth current limiting module L6 arranged between the other terminal of the fourth switching module K4 and the first power ground. As an example, the sixth current limiting module L6 includes a sixth resistor network. Specifically, the sixth resistor network includes a resistor R6, wherein one terminal of the resistor R6 is connected to the other terminal of the switch S2, and the other terminal of the resistor R6 is connected to the first power ground.

Referring to FIG. 7, in some embodiments, in order to further limit the current and avoid the damage to the devices in the high voltage interlock circuit, the high voltage interlock circuit also includes a seventh current limiting module. As an example, the seventh current limiting module includes a seventh resistor network. Specifically, the seventh resistor network includes a resistor R7, wherein one terminal of the resistor R7 is connected to the other terminal of the high voltage component module G, and the other terminal of the resistor R7 is connected to an anode of the photodiode D1 and a cathode of the photodiode D2, respectively.

In some other embodiments of the application, in order to avoid the damage to the first power supply when the high voltage component module G is short connected to a large external power supply, the high voltage interlock circuit also includes a first anti-reverse module (not shown in FIG. 7) arranged between the first power supply V1 and one terminal of the high voltage component module G. There is no specific restriction for the position of the first anti-reverse module. The first anti-reverse module may be set between the first power supply V1 and the first current limiting module, between the first current limiting module and the first switching module K1, or between the first switching module K1 and one terminal of the high voltage component module G. As an example, the first anti-reverse module may be an anti-reverse diode.

In other embodiments of the application, in order to avoid the damage to the fourth power supply V4 when the high voltage component module G is short connected to a large external power supply, the high voltage interlock circuit also includes a second anti-reverse module (not shown in FIG. 7) arranged between the fourth power supply V4 and the second power ground. There is no specific restriction for the position of the second anti-reverse module. The second anti-reverse module may be set between the fourth power V4 and the fourth current limiting module, between the fourth current limiting module and the fourth switching module K4, or between the fourth switching module K4 and the first power ground. As an example, the second anti-reverse module may be an anti-reverse diode.

In some embodiments of the application, a first capacitor (not shown in FIG. 7) may be connected in parallel between both ends of the fifth current limiting module L5 to filter low-frequency signals, reducing the interference of low-frequency signals and improving the accuracy of fault detection.

In some embodiments of the application, the high voltage interlock circuit may also include a second capacitor (not shown in FIG. 7), one terminal of the second capacitor is connected to one terminal of the resistor R7, and the other terminal of the second capacitor is connected to the first power ground, which is used for filtering, reducing the interference of other signals, and improving the accuracy of fault detection.

Figure 8:
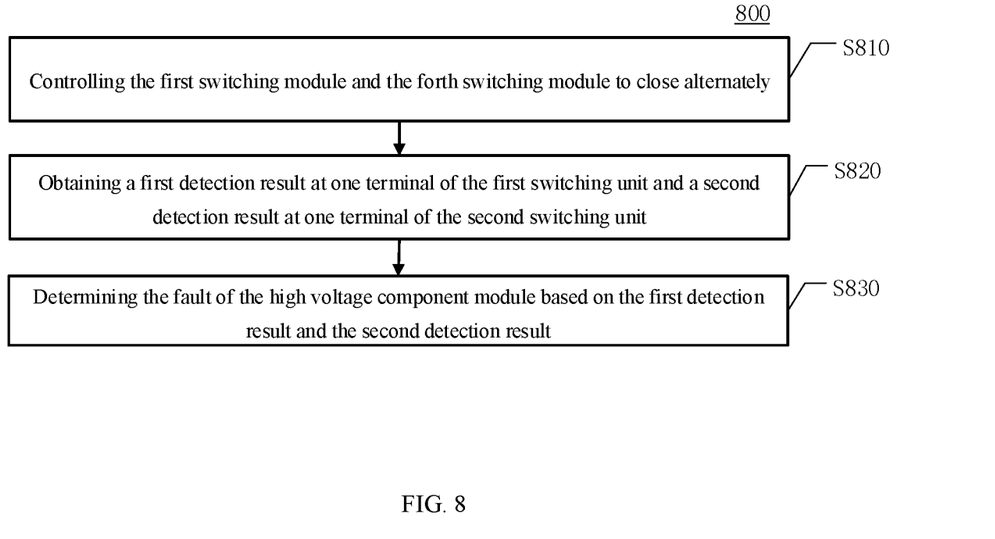
FIG. 8 is a flow diagram for an embodiment of the detection method of the high voltage interlock circuit according to the application.

The embodiments of the application also provide a detection method for high voltage interlock circuit, and FIG. 8 shows a flow diagram for the detection method 800 of high voltage interlock circuit, which is used for the high voltage interlock circuit as shown in FIGS. 1 and 7. The detection method 800 of the high voltage interlock circuit according to the embodiments of the application comprises:

S810, controlling the first switching module K1 and the fourth switching module K4 to close alternately;

S820, obtaining a first detection result at one terminal of the first switching unit J1 and a second detection result at one terminal of the second switching unit J2;

S830, determining the fault of the high voltage component module G based on the first detection result and the second detection result.

In some embodiments of the application, the S810 includes:

When the first switching module K1 is closed, if the first detection result is less than the first preset voltage threshold, and the second detection result is greater than the second preset voltage threshold, and when the fourth switching module K4 is closed, if the first detection result and the second detection result are greater than the second preset voltage threshold, then it is determined that the high voltage component module G has a short-connected power supply fault;

When the first switching module K1 is closed, if the first detection result and the second detection result are greater than the second preset voltage threshold, and when the fourth switching module K4 is closed, if the first detection result is greater than the second preset voltage threshold, and the second detection result is less than the first preset voltage threshold, then it is determined that the high voltage component module G has a short-connected power ground fault;

When the first switching module K1 is closed, if the first detection result and the second detection result are greater than the second preset voltage threshold, and when the fourth switching module K4 is closed, if the first detection result and the second detection result are greater than the second preset voltage threshold, then it is determined that the high voltage component module G has an open circuit fault.

In some embodiments of the application, the detection method of the high voltage interlock circuit further includes:

Controlling both the first switching module K1 and the fourth switching module K4 to be disconnected;

Obtaining a third detection result at one terminal of the first switching unit J1 and a fourth detection result at one terminal of the second switching unit J2; and Determining the fault of the high voltage component module G based on the third detection result and the fourth detection result.

In some embodiments of the application, if the third detection result is less than the first preset voltage threshold and the fourth detection result is greater than the second preset voltage threshold, then it is determined that the high voltage component module G has a short-connected power supply fault.

By using the first detection result and the second detection result obtained when the first switching module K1 and the fourth switching module K4 are alternately closed, the detection method according to the embodiments of the application may avoid obtaining the detection signal from the input and output terminals of the high voltage interlock circuit, and avoid the damage to the controller caused by the large external voltage, to further accurately determine the fault type of high voltage component module G, and improve the fault detection accuracy of high voltage interlock circuit.

It should be clear that all the embodiments in this specification are described in a progressive manner, and the same or similar parts of the embodiments can be referred to each other. Each embodiment focuses on the differences from other embodiments. For the detection method embodiment of the high voltage interlock circuit, please refer to the description of high voltage interlock circuit for relevant points. The present application is not limited to the specific steps and structures described above and shown in the figures. Those skilled in the art can make various changes, modifications and additions, or change the order of steps after understanding the gist of the application. Moreover, for the sake of brevity, a detailed description of known methods and techniques is omitted here.

What is claimed is:

1. A high voltage interlock circuit comprising:
a first switching module, one terminal of the first switching module being connected to a first power supply, and the other terminal of the first switching module being connected to one terminal of a high voltage component module and a first power ground;
a second switching module comprises a first driving unit and a first switching unit arranged in isolation, the first driving unit being used to drive the first switching unit to close, a current input terminal of the first driving unit being connected to the other terminal of the high voltage component module, one terminal of the first switching unit being connected to a second power supply, and the other terminal of the first switching unit being connected to a second power ground;
a third switching module comprises a second driving unit and a second switching unit arranged in isolation, the second driving unit being used to drive the second switching unit to close, a current output terminal of the second driving unit being connected to the other terminal of the high voltage component module, one terminal of the second switching unit being connected to a third power supply, and the other terminal of the second switching unit being connected to the second power ground;
a fourth switching module, one terminal of the fourth switching module being connected to a fourth power supply, and the other terminal of the fourth switching module being connected to a current output terminal of the first driving unit, a current input terminal of the second driving unit and the first power ground;
a controller, configured to control the first switching module and the fourth switching module to close alternately, obtain a first detection result at one terminal of the first switching unit and a second detection result at one terminal of the second switching unit, and determine a fault of the high voltage component module based on the first detection result and the second detection result.

2. The high voltage interlock circuit of claim 1, wherein the first driving unit and/or the second driving unit are light emitting elements;
the first switching unit and/or the second switching unit are optical switches.

3. The high voltage interlock circuit of claim 2, wherein the light emitting elements are photodiodes;
the optical switches are metal oxide semiconductor field effect transistors or photoelectric triodes.

4. The high voltage interlock circuit of claim 1, wherein the controller is specifically configured to:
determine that the high voltage component module has a short-connected power supply fault, under a condition that the first detection result is less than a first preset voltage threshold and the second detection result is greater than a second preset voltage threshold when the first switching module is closed, and both the first detection result and the second detection result are greater than the second preset voltage threshold when the fourth switching module is closed;
determine that the high voltage component module has a short-connected power ground fault, under a condition that both the first detection result and the second detection result are greater than the second preset voltage threshold when the first switching module is closed, and the first detection result is greater than the second preset voltage threshold and the second detection result is less than the first preset voltage threshold when the fourth switching module is closed;
determine that the high voltage component module has an open circuit fault, under a condition that both the first detection result and the second detection result are greater than the second preset voltage threshold when the first switching module is closed, and both the first detection result and the second detection result are greater than the second preset voltage threshold when the fourth switching module is closed.

5. The high voltage interlock circuit of claim 1, wherein the controller is further configured to control both the first switching module and the fourth switching module to be disconnected, obtain a third detection result at one terminal of the first switching unit and a fourth detection result at one terminal of the second switching unit, and determine the fault of the high voltage component module based on the third detection result and the fourth detection result.

6. The high voltage interlock circuit of claim 5, wherein the controller is configured to determine that the high voltage component module has a short-connected power supply fault when the third detection result is less than a first preset voltage threshold and the fourth detection result is greater than a second preset voltage threshold.

7. The high voltage interlock circuit of claim 1, further comprising:
a first current limiting module, arranged between the first switching module and the first power supply;
a second current limiting module, arranged between the second power supply and one terminal of the first switching unit;

a third current limiting module, arranged between the third power supply and one terminal of the second switching unit;

a fourth current limiting module, arranged between one terminal of the fourth switching module and the fourth power supply.

8. The high voltage interlock circuit of claim 1, further comprising:

a first current limiting module, arranged between the other terminal of the first switching module and the first power ground;

a second current limiting module, arranged between the other terminal of the fourth switching module and the first power ground.

9. The high voltage interlock circuit of claim 1, further comprising:

a first anti-reverse module, arranged between one terminal of the high voltage component module and the first power supply;

a second anti-reverse module, arranged between the fourth power supply and the second power ground.

10. A detection method for a high-voltage interlock circuit, applied to the high voltage interlock circuit of claim 1, the method comprising:

controlling the first switching module and the fourth switching module to close alternately;

obtaining the first detection result at one terminal of the first switching unit and the second detection result at one terminal of the second switching unit;

determining the fault of the high voltage component module based on the first detection result and the second detection result.

11. The method of claim 10, wherein the determining the fault of the high voltage component module based on the first detection result and the second detection result comprises:

determining that the high voltage component module has a short-connected power supply fault, under a condition that the first detection result is less than a first preset voltage threshold and the second detection result is greater than a second preset voltage threshold when the first switching module is closed, and both the first detection result and the second detection result are greater than the second preset voltage threshold when the fourth switching module is closed;

determining that the high voltage component module has a short-connected power ground fault, under a condition that both the first detection result and the second detection result are greater than the second preset voltage threshold when the first switching module is closed, and the first detection result is greater than the second preset voltage threshold and the second detection result is less than the first preset voltage threshold when the fourth switching module is closed;

determining that the high voltage component module has an open circuit fault, under a condition that both the first detection result and the second detection result are greater than the second preset voltage threshold when the first switching module is closed, and both the first detection result and the second detection result are greater than the second preset voltage threshold when the fourth switching module is closed.

12. The method of claim 10, further comprising:

controlling both the first switching module and the fourth switching module to be disconnected;

obtaining a third detection result at one terminal of the first switching unit and a fourth detection result at one terminal of the second switching unit;

determining the fault of the high voltage component module based on the third detection result and the fourth detection result.

13. The method of claim 12, wherein the determining the fault of the high voltage component module based on the third detection result and the fourth detection result comprises:

determining that the high voltage component module has a short-connected power supply fault when the third detection result is less than a first preset voltage threshold and the fourth detection result is greater than a second preset voltage threshold.

* * * * *